United States Patent
Tarabbia et al.

(10) Patent No.: US 9,275,992 B1
(45) Date of Patent: Mar. 1, 2016

(54) FORMATION OF ELECTRICAL COMPONENTS ON A SEMICONDUCTOR SUBSTRATE BY POLISHING TO ISOLATE THE COMPONENTS

(71) Applicant: Cirrus Logic, Inc., Austin, TX (US)

(72) Inventors: Marc L. Tarabbia, Austin, TX (US); Shanjen Pan, Austin, TX (US)

(73) Assignee: CIRRUS LOGIC, INC., Austin, TX (US)

( * ) Notice: Subject to any disclaimer, the term of this patent is extended or adjusted under 35 U.S.C. 154(b) by 0 days.

(21) Appl. No.: 14/559,602

(22) Filed: Dec. 3, 2014

(51) Int. Cl.
*H01L 21/00* (2006.01)
*H01L 27/06* (2006.01)
*H01L 49/02* (2006.01)

(52) U.S. Cl.
CPC ............ *H01L 27/0682* (2013.01); *H01L 28/20* (2013.01); *H01L 28/40* (2013.01)

(58) Field of Classification Search
CPC ....................................................... H01L 21/00
USPC ............................................. 257/211; 438/6
See application file for complete search history.

(56) References Cited

U.S. PATENT DOCUMENTS

2004/0087043 A1* 5/2004 Lee et al. ........................ 438/6

OTHER PUBLICATIONS

Zurcher et al., "Integration of Thin MIM Capacitors and Resistors into Copper Metallization based RF-CMOS and Bi-CMOS Technologies", Electron Devices Meeting, Dec. 10-13, 2000,Technical Digest. International, pp. 153-156.

* cited by examiner

*Primary Examiner* — Marc Armand
(74) *Attorney, Agent, or Firm* — Norton Rose Fulbright US LLP (57) ABSTRACT

Trenches may be formed in layers on a semiconductor substrate for defining electrical components for an electronic device, such as an amplifier. A polishing step may be performed after formation of the trenches and deposition of other layer(s) to define regions for resistors, capacitors, or other elements in a metal layer on a semiconductor substrate. The polishing step may create discontinuities in metal layers on the semiconductor substrate that define electrically isolated regions corresponding to the resistors, capacitor, and other components of the electronic device.

26 Claims, 5 Drawing Sheets

FORMATION OF ELECTRICAL COMPONENTS ON A SEMICONDUCTOR SUBSTRATE BY POLISHING TO ISOLATE THE COMPONENTS

FIELD OF THE DISCLOSURE

The instant disclosure relates to integrated circuits. More specifically, this disclosure relates to the manufacturing of integrated circuits.

BACKGROUND

As electronic devices have increased in operational functionality and complexity, the cost and difficulties with manufacturing the electronic devices has also increased. In particular, the processing of semiconductor wafers to form components for the electronic devices has become increasingly complex. For example, to shrink the size of an electronic device, the components on the semiconductor wafer must be smaller and the components on the semiconductor wafer must be packed closer together to increase the density of the components. In addition to manufacturing challenges for making smaller components, the components are typically more complex and require many processing steps to form the components on the semiconductor substrate. Of the processing steps, patterning steps are often the most expensive to perform because each patterning step may require a different mask. Masks are pieces of glass that contain patterns that are copied repeatedly onto each semiconductor substrate to form the components. Masks have a limited lifetime and are expensive to create.

As one example, amplifiers are used in many electronic devices. In particular, cellular phones and audio players use amplifiers to produce signals for driving speakers in the devices or headphones connected to the devices. Amplifiers may include resistor and capacitor components that are difficult to form on a semiconductor substrate. Conventionally, manufacturing resistors, capacitors, and other components for an amplifier on the semiconductor substrate requires patterning using two, three, or more masks. Each mask adds complexity and cost to the manufacturing process.

Figure 1:
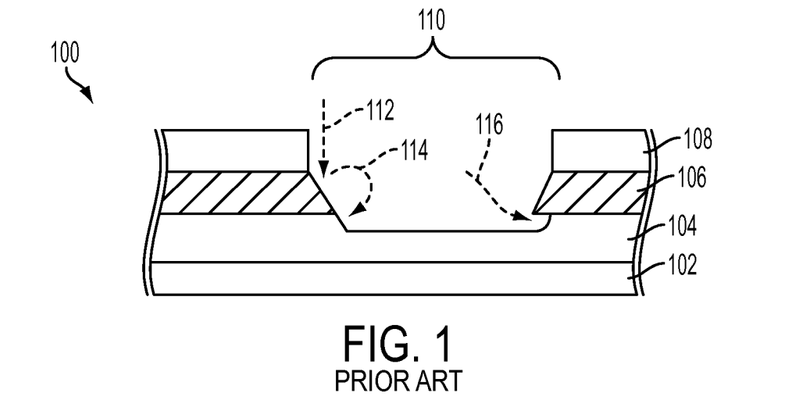
FIG. 1 is a cross-sectional view of a semiconductor substrate structure showing certain problems encountered during a conventional dry etch process of metal layers.

Further, one or more metal layers of the resistor, capacitor, or other components are patterned with a dry or wet etch process. The wet or dry etch of the metal layer may create undesirable effects due to the difficulty of etching metal layers. FIG. 1 shows certain problems encountered during a conventional dry etch process of metal layers. A structure 100 on a semiconductor substrate (not shown) may include a nitride layer 102, a dielectric layer 104, and a conducting layer 106. A hard mask layer 108 may be deposited and patterned with a mask to form opening 110, which will be transferred to the conducting layer 106 through a dry etch. During the dry etch process, ions from a plasma bombard the conducting layer 106 and cause physical removal of atoms of the conducting layer 106. This patterning may form a portion of a resistor or capacitor for an amplifier in the conducting layer 106. During the dry etch process, undesirable effects may occur that negatively impact the structure 100. For example, the opening 110 may not transfer directly into the conducting layer 106. Instead, an angled sidewall 112 may change the shape of the feature of opening 110 in the conducting layer 106. As another example, material etched from the conducting layer 106 may redeposit material 114 onto the dielectric layer 104 during the plasma etch operation. The conducting materials redeposited 114 onto the dielectric layer 104 reduce the dielectric strength of the dielectric layer 104 and reduce the reliability of components formed with the dielectric layer 104. As a further example, the dry etch may undercut a void 116 in the dielectric layer 104. Each of these examples illustrate that the dry etch may not transfer the pattern of opening 110 into the underlying structure 100 with high fidelity. The problems may be further enhanced when the conducting layer 106 is a material that is difficult to etch, such as such as tantalum, tantalum nitride, Titanium, Titanium nitride, Silicon Chromium.

Shortcomings mentioned here are only representative and are included simply to highlight that a need exists for improved electrical components, particularly for amplifiers in consumer-level devices. Embodiments described here address certain shortcomings but not necessarily each and every one described here or known in the art.

SUMMARY

A polishing step may be introduced into the semiconductor manufacturing process to reduce problems that occur during wet or dry etching. For example, a trench and polish process may be used to define regions for resistors, capacitors, or other elements in a metal layer on a semiconductor substrate. In one embodiment, a buffer layer may be deposited on the semiconductor substrate during the manufacturing process. The buffer layer may be used as an etch stop layer for the polishing step, as well as for subsequent etch steps. Prior to the polishing step, trenches may be formed on the semiconductor substrate that defines electrically isolated regions corresponding to the resistors, capacitor, and other components of an electronic device, such as an amplifier. After the trenches are formed, the polishing step may be used to level a surface of the semiconductor substrate, during which at least one metal layer of the electronic device is cut into electrically isolated regions corresponding to the trenches.

According to one embodiment, a method for manufacturing an apparatus having a resistor, a capacitor, and/or other components on a semiconductor substrate may include depositing a first metal layer; depositing a first dielectric layer on the first metal layer; patterning the dielectric layer to define trenches in the dielectric layer corresponding to the resistor and the capacitor, wherein the trenches expose at least a portion of the first metal layer; depositing a second dielectric layer on the first dielectric layer and the trenches; depositing a second metal layer on the second dielectric layer, wherein the second metal layer comprises a portion of the resistor and a portion of the capacitor; depositing a buffer layer on the second metal layer; and/or polishing the semiconductor substrate to isolate the resistor from the capacitor without exposing a horizontal plane of the second metal layer by stopping the polishing process before the buffer layer is completely removed.

In certain embodiments, the step of polishing the semiconductor substrate comprises forming a level surface with dielectric exposed on at least a portion of the level surface; the step of depositing the first dielectric layer comprises depositing two dielectric layers comprising an interlayer dielectric layer and a passivation layer; the step of depositing the buffer layer comprises depositing two dielectric layers comprising an interlayer dielectric layer and a passivation layer; the interlayer dielectric layer may include silicon oxide; the passivation layer may comprise at least one of a tantalum compound and a titanium compound; the step of depositing the buffer layer comprises depositing between approximately 30 and 100 nanometers of an insulator, wherein the step of depositing the second metal layer comprises depositing between approximately 50 and 200 nanometers of a conductor, wherein the step of depositing the second dielectric layer comprises depositing between approximately 500 and 1000 nanometers of an insulator, and wherein the step of forming the first metal layer comprises depositing between approximately 400 and 1500 nanometers of a conductor; the step of depositing the buffer layer may include depositing a material having a polishing rate slower than the second metal layer; the step of depositing the buffer layer may include depositing a nitride; the step of polishing the semiconductor substrate comprises performing chemical mechanical polishing (CMP); and/or the step of patterning the trenches may include patterning the trenches with a single mask.

In some embodiments, the method may also include forming at least one first via extending through the buffer layer to the second metal layer in a first trench of the patterned trenches, in which the step of forming the at least one first via may include forming two first vias extending to the second metal layer, wherein the two first vias comprise contacts for the resistor; and/or forming at least one second via extending through the buffer layer to the second metal layer in a second trench of the patterned trenches, in which the step of forming the at least one second via may include forming two second vias, wherein a second via extends to the first metal layer and wherein the two second vias comprise contacts for the capacitor; the at least one first via and the at least one second via may be formed during a same etching process; the step of forming the first metal layer may include forming at least one layer of aluminum and at least one layer based on tantalum or titanium compounds.

According to another embodiment, an apparatus may include a component manufactured on a semiconductor manufacturing process described herein. For example, a semiconductor substrate may include a first metal layer; a first dielectric layer on the first metal layer; a second metal layer on the first dielectric layer; and/or a buffer layer on the second metal layer, wherein the second metal layer is discontinuous such that the second metal layer forms at least a first region and a second region electrically isolated from the first region, in which the first region comprises a portion of a resistor and the second region comprises a portion of a capacitor.

In certain embodiments, the buffer layer comprises an insulating oxide and/or nitride; the second metal layer comprises tantalum nitride; and/or the resistor and the capacitor may include a portion of an amplifier device.

In some embodiments, the semiconductor substrate may also include at least one first via extending through the buffer layer to the second metal layer in the first region, wherein the at least one first via comprises a contact for the resistor; and/or at least one second via extending through the buffer layer to the second metal layer in the second region, wherein the at least one second via comprises a contact for the capacitor.

In a further embodiment, an apparatus may include an amplifier having at least a resistor and a capacitor, wherein the amplifier is manufactured on a semiconductor substrate, and wherein the resistor and the capacitor comprise a metal layer at a same horizontal level on the semiconductor substrate and the metal layer is discontinuous between a first region corresponding to the resistor and a second region corresponding to the capacitor, and wherein at least a portion of the metal layer is covered by a buffer layer.

In certain embodiments, the semiconductor substrate may include a first metal layer and a first dielectric layer on the first metal layer, wherein the metal layer is on the first dielectric layer; the buffer layer may include an insulating nitride; and/or the metal layer may include tantalum nitride.

In some embodiments, the apparatus may also include at least one first via extending through the buffer layer to the second metal layer in the first region, wherein the at least one first via comprises a contact for the resistor; and/or at least one second via extending through the buffer layer to the second metal layer in the second region, wherein the at least one second via comprises a contact for the capacitor.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

DETAILED DESCRIPTION

Figure 2:
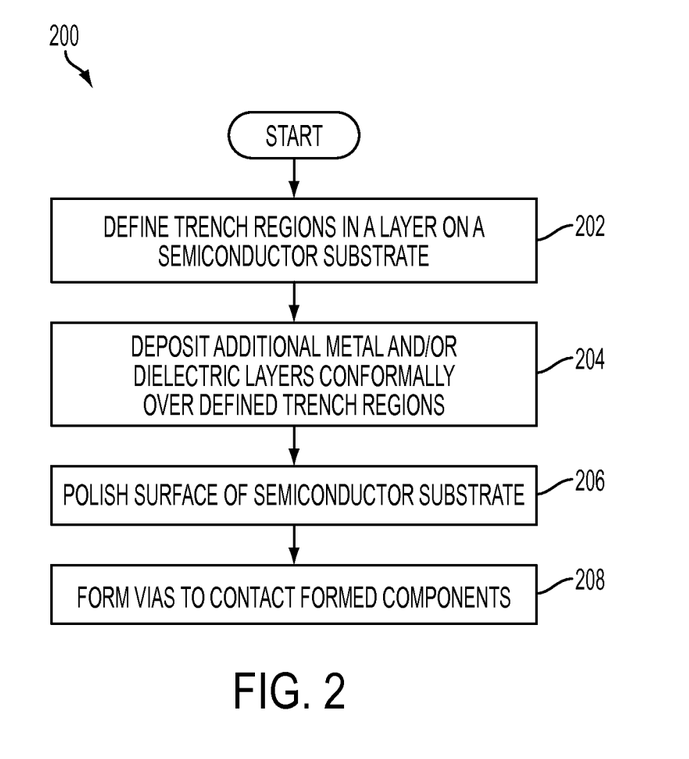
FIG. 2 is a flow chart illustrating a method of manufacturing components of electronic devices with a polishing step according to one embodiment of the disclosure.
Figure 3A:
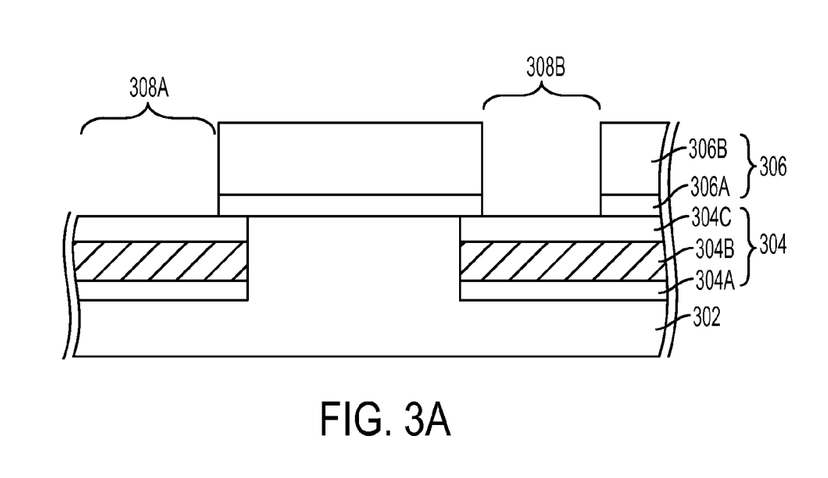
FIG. 3A is a cross-section illustrating a semiconductor substrate after patterning of trench regions for defining components on the semiconductor substrate according to one embodiment of the disclosure.

One embodiment of a manufacturing process incorporating a polishing step for at least partially electrically isolating regions on a semiconductor substrate to form components of an electronic device is described in the flow chart of FIG. 2 with reference to the intermediate cross-sections illustrated in FIGS. 3A-3D. FIG. 2 is a flow chart illustrating a method of manufacturing components of electronic devices with a polishing step according to one embodiment of the disclosure. A method 200 may begin at block 202 with defining trench regions on a semiconductor substrate to define regions corresponding to components for an electronic device. A semiconductor substrate after block 202 is shown in FIG. 3A.

FIG. 3A is a cross-section illustrating a semiconductor substrate after patterning of trench regions for defining components on the semiconductor substrate according to one embodiment of the disclosure. A dielectric layer 302, such as an interlayer dielectric (ILD), may be located on a semiconductor substrate (not shown). A first metal layer 304 may be deposited on the dielectric layer 302. The first metal layer 304 may include several layers including, for example, a titanium nitride layer 304A, an aluminum layer 304B, and/or a titanium nitride layer 304C. A first dielectric layer 306 may be deposited on the first metal layer 304 and portions of the dielectric layer 302. The first dielectric layer 306 may include multiple layers, including an insulating layer 306A and an insulating layer 306B. Trenches 308 may be patterned in the first dielectric layer 306 to form regions corresponding to components for an electronic device, including, for example, a resistor and a capacitor. In one embodiment, a trench 308A defines a first region for a resistor and a trench 308B defines a second region for a capacitor.

Figure 3B:
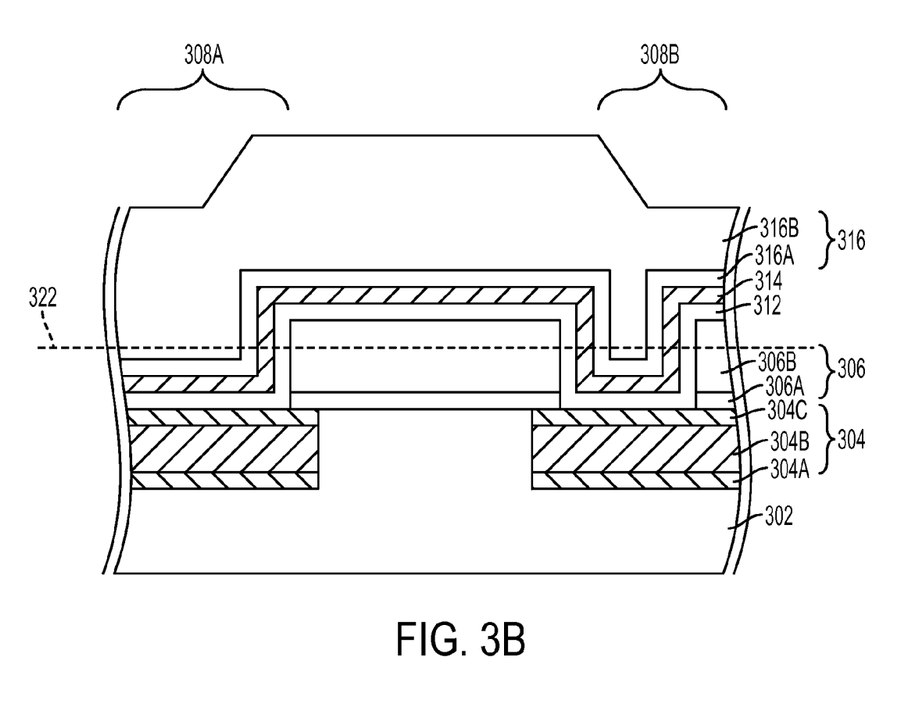
FIG. 3B is a cross-section illustrating a semiconductor substrate after deposition of a buffer layer according to one embodiment of the disclosure.

Referring back to FIG. 2, after defining trench regions at block 202, additional dielectric and/or conducting layers may be deposited at block 204. A semiconductor substrate after block 204 is shown in FIG. 3B. FIG. 3B is a cross-section illustrating a semiconductor substrate after deposition of a buffer layer according to one embodiment of the disclosure. A second dielectric layer 312 may be deposited across portions of or the entire semiconductor substrate. The second dielectric layer 312 may be deposited in such a way that the second dielectric layer 312 has an approximately uniform thickness above the first metal layer 304, above the first dielectric layer 306, and on sidewalls of the trenches 308. Then, a second metal layer 314 may be deposited on the second dielectric layer 312, and a buffer layer 316 may be deposited on the conducting layer 314. The buffer layer 316 may include multiple layers, including an insulating layer 316A and an insulating layer 316B. The buffer layer 316 may comprise silicon oxide and/or silicon nitride.

Figure 3C:
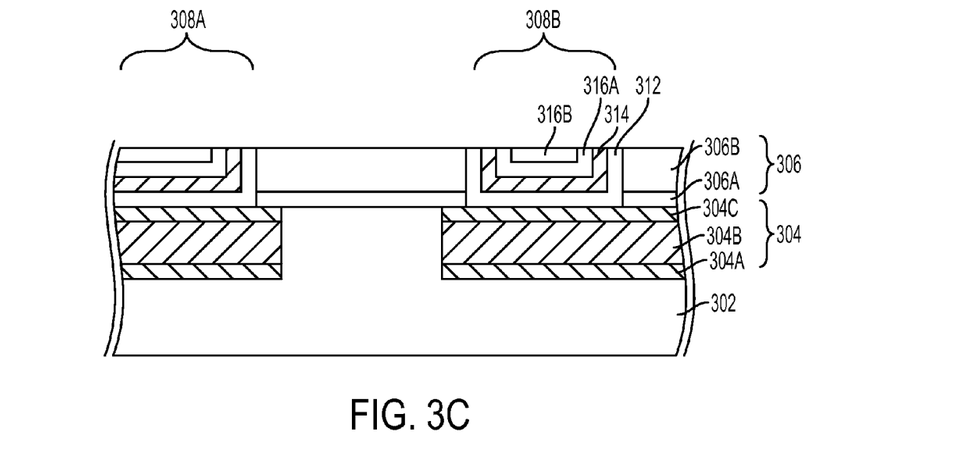
FIG. 3C is a cross-section illustrating a semiconductor substrate after a polishing step to electrically isolate the defined regions in at least one metal layer according to one embodiment of the disclosure.

Referring again back to FIG. 2, after depositing additional layers at block 204, a polishing step may be performed at block 206. A semiconductor substrate after block 206 is shown in FIG. 3C. FIG. 3C is a cross-section illustrating a semiconductor substrate after a polishing step to electrically isolate the defined regions in at least one metal layer according to one embodiment of the disclosure. Polishing may form a level surface across at least a portion of the semiconductor substrate. The polishing step may level the surface and remove the buffer layer 316 or remove a portion of the buffer layer 316 to leave a thin portion of the buffer layer 316, such as by polishing to etch stop line 322 of FIG. 3B. In one embodiment, the polishing stops before exposing a horizontal plane portion of the second metal layer 314. In one embodiment, the polishing step removes material down to the buffer layer 316A. After polishing, portions of the second metal layer 314 between the trenches 308 are removed, which at least partially electrically isolates regions of the semiconductor substrate because the metal layer 314 does not extend between the trenches 308. These electrically isolated regions may form components of an electronic device, such as a resistor and/or a capacitor.

Figure 3D:
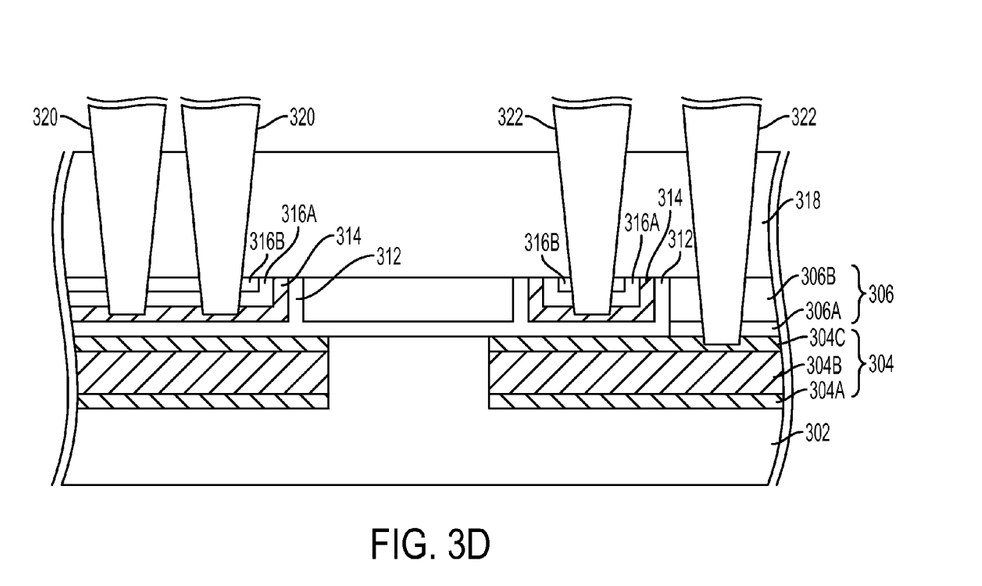
FIG. 3D is a cross-section illustrating a semiconductor substrate after forming vias for contacting a metal layer in each of the electrically isolated regions according to one embodiment of the disclosure.

Referring back to FIG. 2, after polishing the semiconductor substrate, vias may be formed at block 208 to contact a resistor and/or a capacitor formed during blocks 202, 204, and 206. The vias may contact either of the second metal layer 314 and/or the first metal layer 304. A semiconductor substrate after block 208 is shown in FIG. 3D. FIG. 3D is a cross-section illustrating a semiconductor substrate after forming vias for contacting a metal layer in each of the electrically isolated regions according to one embodiment of the disclosure. An insulating layer 318 may be deposited across at least a portion of the semiconductor wafer. The insulating layer 318 may be, for example, a passivation layer for sealing the semiconductor wafer from the surrounding environment. The passivation layer may comprise a tantalum compound, such as tantalum nitride, and/or a titanium compound, such as titanium nitride. First vias 320 may be formed to extend through the insulating layer 318 and the buffer layer 316 to reach the second metal layer 314. Two or more of the first vias 320 may form contacts of a resistor, in which the resistance of the resistor is proportional to the length, width, and material properties of the second metal layer 314. Second vias 322 may be formed to extend through the insulating layer 318 and the buffer layer 316 to reach the second metal layer 314 and/or may be formed to extend through the insulating layer 318 and the first dielectric layer 306 to reach the first metal layer 304. Two or more of the second vias 322 may form contacts of a metal-insulator-metal (MIM) capacitor having a capacitance defined by the length, width, and material properties of the first dielectric layer 306 between the first metal layer 304 and the second metal layer 314. The first vias 320 and the second vias 322 may be formed during the same etching process.

Figure 4:
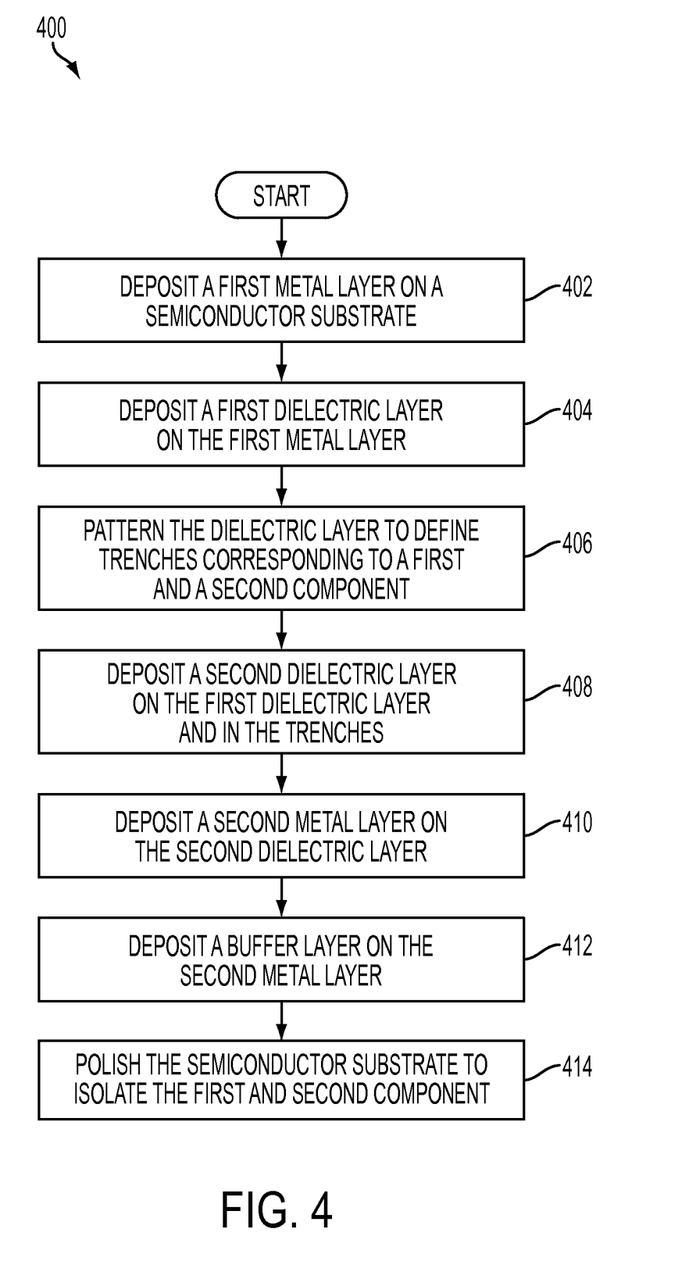
FIG. 4 is a flow chart illustrating a method of manufacturing components of electronic devices with a polishing step according to one embodiment of the disclosure.

One embodiment of the manufacturing process described above is described with more detail with reference to the flow chart of FIG. 4. FIG. 4 is a flow chart illustrating a method of manufacturing components of electronic devices with a polishing step according to one embodiment of the disclosure. A method 400 begins at block 402 with depositing a first metal layer on a semiconductor substrate. The metal layer may be deposited on the semiconductor substrate after other layers have already been deposited on the semiconductor substrate, such as an interlayer dielectric (ILD). Although the term semiconductor substrate is used, the term may be understood to include materials that are not traditional silicon but nevertheless serve as a base for construction of electronic devices, such as but not limited to sapphire ($Al_2O_3$), silicon germanium (SiGe), gallium arsenide (GaAs), and the like. The first metal layer may form conductive portions of a first and second component being manufactured on the semiconductor substrate. In one embodiment, the first metal layer may be deposited into trenches pre-formed on the semiconductor substrate. In another embodiment, the first metal layer may be deposited and etched back to form distinct regions for the components.

At block 404, a first dielectric layer is deposited on at least a portion of the first metal layer. At block 406, the dielectric layer is patterned to define trenches corresponding to at least a first and a second component. The first and second components may have the same electrical function or different electrical functions. For example, the first and second component may both be capacitors. In another example, the first component may be a resistor and the second component may be a capacitor. The trenches defined in block 406 before deposition of additional layers may allow a later polishing step to be used in the formation of the first and second components, rather than use of a wet or dry etch process.

After trench formation at block 406, the method 400 may continue to block 408 to deposit a second dielectric layer on the first dielectric layer and in the trenches. The second dielectric layer may be deposited conformally across the semiconductor substrate to nearly equally cover the first dielectric layer, bottom of the trenches, and sidewalls of the trenches. At block 410, a second metal layer may be deposited on the second dielectric layer. The second metal layer may be deposited conformally across the semiconductor substrate to nearly equally cover all features of the second dielectric layer. At block 412, a buffer layer may be deposited on the second metal layer. The buffer layer may be deposited conformally across the semiconductor substrate to nearly equally cover all features of the second metal layer. Finally, at block 414, the semiconductor substrate may be polished to etch back regions of the buffer layer to create a discontinuity in the second metal layer thereby at least partially electrically isolating the first component from the second component. In one embodiment, the polishing of block 414 may include chemical mechanical polishing (CMP). After the first and second components are at least partially electrically isolated, vias may be formed for making electrical contact with the first and the second components.

Figure 5:
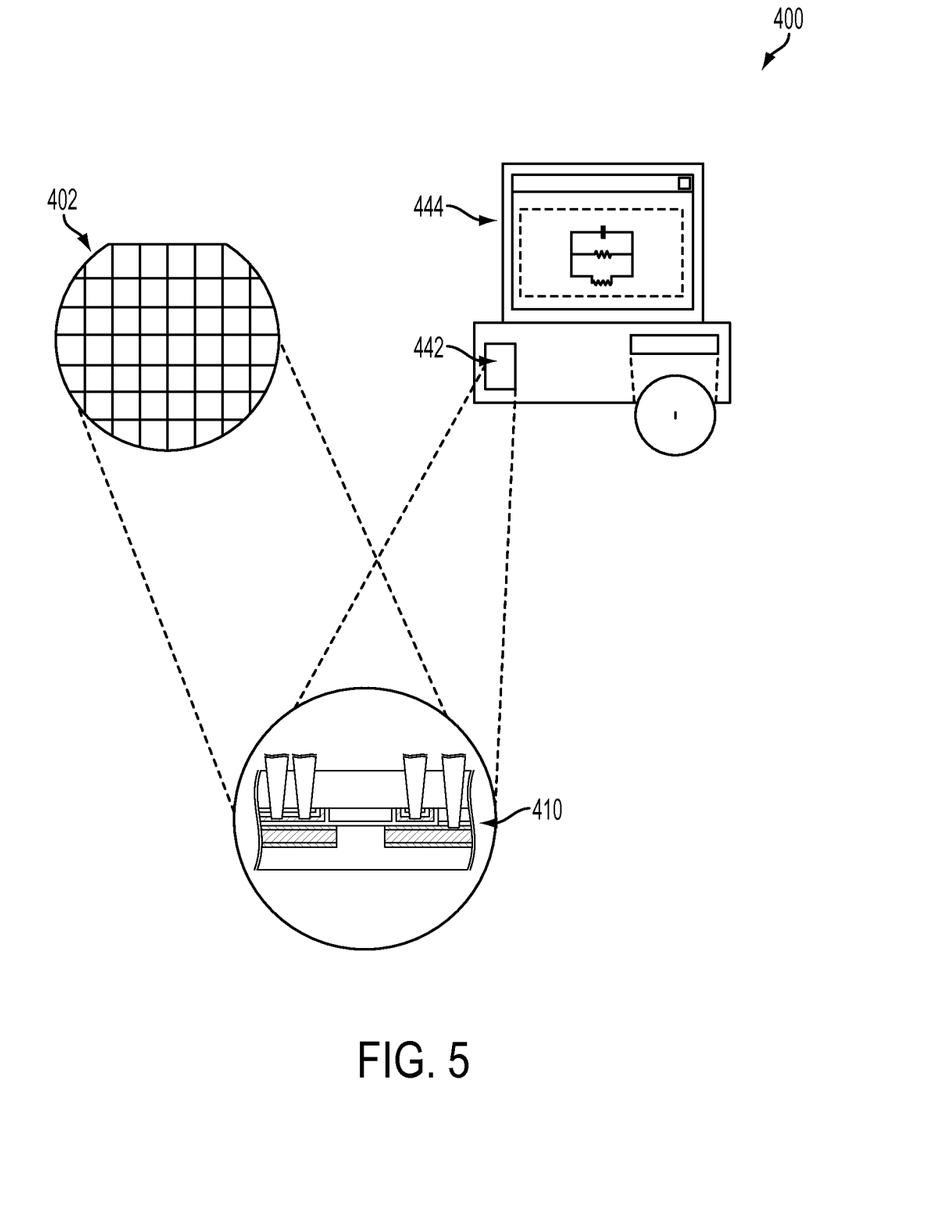
FIG. 5 is a block diagram illustrating an apparatus incorporating components on a semiconductor substrate manufactured according to the processes described herein according to one embodiment of the disclosure.

FIG. 5 is a block diagram illustrating an apparatus incorporating components on a semiconductor substrate manufactured according to the processes described herein according to one embodiment of the disclosure. In one case, components 410 may be manufactured on a wafer 402. The wafer 402 may be singulated into one or more dies that may contain the components 410. Additionally, the wafer 402 may experience further semiconductor manufacturing before singulation. For example, the wafer 402 may be bonded to a carrier wafer, a packaging bulk region, a second wafer, or transferred to another fabrication facility. After dies are singulated from the wafer 402, the dies may be incorporated into an electronic device 444 such as, for example, a personal computer, a mobile device, mobile phones, hand-held personal communication systems (PCS) units, portable data units such as personal data assistants, global positioning system (GPS) enabled devices, navigation devices, set top boxes, music players, video players, entertainment units, fixed location data units such as meter reading equipment, or any other device that incorporates electronic components. In one embodiment, the personal computer or mobile device may include an amplifier 442 that includes the component 410. Additionally, other parts of the electronic device 444 may include the component 410, such as a central processing unit (CPU), a digital-to-analog converter (DAC), an analog-to-digital converter (ADC), a graphics processing unit (GPU), a microcontroller, or a communications controller.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for manufacturing an apparatus comprising a resistor and a capacitor on a semiconductor substrate, the method comprising:

depositing a first metal layer;
depositing a first dielectric layer on the first metal layer;
patterning the dielectric layer to define trenches in the dielectric layer corresponding to the resistor and the capacitor, wherein the trenches expose at least a portion of the first metal layer;
depositing a second dielectric layer on the first dielectric layer and the trenches;
depositing a second metal layer on the second dielectric layer, wherein the second metal layer comprises a portion of the resistor and a portion of the capacitor;
depositing a buffer layer on the second metal layer; and
polishing the semiconductor substrate to isolate the resistor from the capacitor without exposing a horizontal plane of the second metal layer by stopping the polishing process before the buffer layer is completely removed;
further comprising forming at least one first via extending through the buffer layer to the second metal layer in a first trench of the patterned trenches.

2. The method of claim 1, wherein the step of polishing the semiconductor substrate comprises forming a level surface with dielectric exposed on at least a portion of the level surface.

3. The method of claim 1, wherein the step of forming the at least one first via comprises forming two first vias extending to the second metal layer, wherein the two first vias comprise contacts for the resistor.

4. The method of claim 1, further comprising forming at least one second via extending through the buffer layer to the second metal layer in a second trench of the patterned trenches.

5. The method of claim 1, wherein the step of depositing the first dielectric layer comprises depositing two dielectric layers comprising an interlayer dielectric layer and a passivation layer.

6. The method of claim 1, wherein the step of depositing the buffer layer comprises depositing two dielectric layers comprising an interlayer dielectric layer and a passivation layer.

7. The method of claim 1, wherein the step of forming the first metal layer comprises forming at least one layer of aluminum and at least one layer of titanium nitride.

8. The method of claim 1, wherein the step of depositing the buffer layer comprises depositing between approximately 30 and 100 nanometers of an insulator, wherein the step of depositing the second metal layer comprises depositing between approximately 50 and 200 nanometers of a conductor, wherein the step of depositing the second dielectric layer comprises depositing between approximately 500 and 1000 nanometers of an insulator, and wherein the step of forming the first metal layer comprises depositing between approximately 400 and 1500 nanometers of a conductor.

9. The method of claim 1, wherein the step of depositing the buffer layer comprises depositing a material having a polishing rate slower than the second metal layer.

10. The method of claim 1, wherein the step of polishing the semiconductor substrate comprises performing chemical mechanical polishing (CMP).

11. The method of claim 1, wherein the step of patterning the trenches comprises patterning the trenches with a single mask.

12. The method of claim 4, wherein the step of forming the at least one second via comprises forming two second vias, wherein a second via extends to the first metal layer, wherein the two second vias comprise contacts for the capacitor.

13. The method of claim 4, wherein the at least one first via and the at least one second via are formed during a same etching process.

14. The method of claim 6, wherein the interlayer dielectric layer comprises a silicon oxide and wherein the passivation layer comprises at least one of a tantalum compound and a titanium compound.

15. The method of claim 9, wherein the step of depositing the buffer layer comprises depositing a nitride.

16. A semiconductor substrate, comprising:
a first metal layer;
a first dielectric layer on the first metal layer;
a second metal layer on the first dielectric layer; and
a buffer layer on the second metal,
wherein the second metal layer is discontinuous such that the second metal layer forms at least a first region and a second region electrically isolated from the first region, in which the first region comprises a portion of a resistor and the second region comprises a portion of a capacitor further comprising at least one first via extending through the buffer layer to the second metal layer in the first region, wherein the at least one first via comprises a contact for the resistor.

17. The semiconductor substrate of claim 16, wherein the buffer layer comprises an insulating nitride.

18. The semiconductor substrate of claim 16, wherein the second metal layer comprises tantalum nitride.

19. The semiconductor substrate of claim 16, further comprising at least one second via extending through the buffer layer to the second metal layer in the second region, wherein the at least one second via comprises a contact for the capacitor.

20. The semiconductor substrate of claim 19, wherein the resistor and the capacitor comprise a portion of an amplifier device.

21. An apparatus, comprising:
an amplifier comprising a resistor and a capacitor,
wherein the amplifier is manufactured on a semiconductor substrate, and
wherein the resistor and the capacitor comprise a metal layer at a same horizontal level on the semiconductor substrate and the metal layer is discontinuous between a first region corresponding to the resistor and a second region corresponding to the capacitor, and
wherein at least a portion of the metal layer is covered by a buffer layer further comprising at least one first via extending through the buffer layer to the second metal layer in the first region, wherein the at least one first via comprises a contact for the resistor.

22. The apparatus of claim 21, wherein the semiconductor substrate comprises:
a first metal layer; and
a first dielectric layer on the first metal layer, wherein the metal layer is on the first dielectric layer.

23. The apparatus of claim 21, wherein the buffer layer comprises an insulating nitride.

24. The apparatus of claim 21, wherein the metal layer comprises a tantalum compound.

25. The apparatus of claim 21, further comprising at least one second via extending through the buffer layer to the second metal layer in the second region, wherein the at least one second via comprises a contact for the capacitor.

26. The apparatus of claim 25, wherein the at least one first via and the at least one second via are manufactured during a same etching process.

* * * * *